United States Patent
Goyal et al.

(10) Patent No.: US 9,294,099 B2
(45) Date of Patent: Mar. 22, 2016

(54) HYBRID SYNCHRONOUS/ASYNCHRONOUS COUNTER

(71) Applicants: Rohit Goyal, Noida (IN); Deepak Kumar Behera, Noida (IN); Naman Gupta, Delhi (IN)

(72) Inventors: Rohit Goyal, Noida (IN); Deepak Kumar Behera, Noida (IN); Naman Gupta, Delhi (IN)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 206 days.

(21) Appl. No.: 14/141,458

(22) Filed: Dec. 27, 2013

(65) Prior Publication Data
US 2015/0188546 A1 Jul. 2, 2015

(51) Int. Cl.
| H03K 21/00 | (2006.01) |
| H03K 23/58 | (2006.01) |
| H03K 19/00 | (2006.01) |
| H03K 21/10 | (2006.01) |
| H03K 21/12 | (2006.01) |

(52) U.S. Cl.
CPC .......... *H03K 23/588* (2013.01); *H03K 19/0008* (2013.01); *H03K 21/10* (2013.01); *H03K 21/12* (2013.01); *H03K 23/58* (2013.01)

(58) Field of Classification Search
None
See application file for complete search history.

(56) References Cited

U.S. PATENT DOCUMENTS

| 3,420,990 | A | | 1/1969 | Andrea | |
| 3,805,031 | A | * | 4/1974 | Leibowitz et al. | 377/56 |
| 4,499,589 | A | | 2/1985 | Geesen | |
| 5,045,854 | A | | 9/1991 | Windmiller | |
| 5,060,243 | A | | 10/1991 | Eckert | |
| 5,818,895 | A | * | 10/1998 | Oh | 377/118 |
| 6,434,588 | B1 | | 8/2002 | Kim | |
| 6,822,491 | B1 | * | 11/2004 | Glass | 327/115 |
| 6,961,402 | B1 | * | 11/2005 | Younis | 377/44 |
| 7,145,978 | B2 | | 12/2006 | Lewis | |
| 7,864,915 | B2 | | 1/2011 | Zhang | |
| 7,876,873 | B2 | * | 1/2011 | Hsieh | 377/107 |
| 2008/0317189 | A1 | * | 12/2008 | Zhuang et al. | 375/376 |
| 2012/0008733 | A1 | * | 1/2012 | Yoon et al. | 377/118 |
| 2015/0010124 | A1 | * | 1/2015 | Gupta et al. | 377/118 |

* cited by examiner

*Primary Examiner* — Tuan T Lam
(74) *Attorney, Agent, or Firm* — Charles E. Bergere

(57) ABSTRACT

A hybrid counter generates a multi-bit hybrid counter value. The hybrid counter includes two or more asynchronous counters, each configured to generate a subset of the bits of the multi-bit hybrid counter value. The asynchronous counters are interconnected by a logic gate and a clock gating circuit. The logic gate generates an asynchronous logic value based on the bits generated by the previous asynchronous counters. The clock gating circuit re-times the asynchronous logic value to generate a synchronous logic value that is used to toggle the next asynchronous counter. The hybrid counter functions more accurately than conventional asynchronous counters and with less power than conventional synchronous counters.

12 Claims, 4 Drawing Sheets

US 9,294,099 B2

HYBRID SYNCHRONOUS/ASYNCHRONOUS COUNTER

BACKGROUND OF THE INVENTION

The present invention relates generally to integrated circuits, and more particularly to a counter circuit for counting electronic events.

A counter is a logic circuit used for counting the number of times a particular event (e.g., a rising clock edge) occurs with respect to a clock signal. For example, an 8-bit counter having a sequence of eight registers (e.g., flip-flops) can count up to 256 clock cycles before rolling over. In many high-frequency applications, it is desirable to provide counters that count accurately and with low power consumption.

Conventional counters are either synchronous or asynchronous. Conventional synchronous counters can count accurately, but consume relatively high power because each register consumes dynamic power during each clock cycle whether or not the register toggles.

Conventional asynchronous counters consume relatively low power, but may be inaccurate at high clock frequencies due to the accumulation of the clock-to-q delays of the individual registers. For a given frequency, there is a maximum number of bits that can be configured in an asynchronous counter and still provide accurate counting. Reciprocally, for a given number of bits in an asynchronous counter, there is a maximum frequency at which the asynchronous counter can count accurately.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale. For example, the thicknesses of layers and regions may be exaggerated for clarity.

DETAILED DESCRIPTION OF THE INVENTION

Detailed illustrative embodiments of the present invention are disclosed herein. However, specific structural and functional details disclosed herein are merely representative for purposes of describing example embodiments of the present invention. The present invention may be embodied in many alternate forms and should not be construed as limited to only the embodiments set forth herein. Further, the terminology used herein is for the purpose of describing particular embodiments only and is not intended to be limiting of example embodiments of the invention.

As used herein, the singular forms "a," "an," and "the," are intended to include the plural forms as well, unless the context clearly indicates otherwise. It further will be understood that the terms "comprises," "comprising," "includes," and/or "including," specify the presence of stated features, steps, or components, but do not preclude the presence or addition of one or more other features, steps, or components. It also should be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

In one embodiment, the present invention provides a hybrid counter that generates a multi-bit hybrid counter value based on an applied clock signal. A first asynchronous counter generates, based on the applied clock signal, a first asynchronous multi-bit counter value corresponding to a first subset of the bits of the multi-bit hybrid counter value. A first logic gate generates a first asynchronous logic value based on the first subset of bits. A first clock gating circuit generates a first synchronous logic value based on the first asynchronous logic value and the applied clock signal. A second asynchronous counter generates, based on the first synchronous logic value, a second multi-bit counter value corresponding to a second subset of the bits of the multi-bit hybrid counter value.

In another embodiment, the present invention is a hybrid counter for generating a multi-bit hybrid counter value. The hybrid counter comprises (i) two or more asynchronous counters, each asynchronous counter configured to generate a subset of bits of the multi-bit hybrid counter value, and (ii) a logic AND gate and a clock gating circuit interconnecting each pair of the asynchronous counters. The AND gate generates an asynchronous logic value based on bits generated by one or more previous asynchronous counters, and the clock gating circuit retimes the asynchronous logic value to generate a synchronous logic value that is used to toggle a next asynchronous counter.

Figure 1:
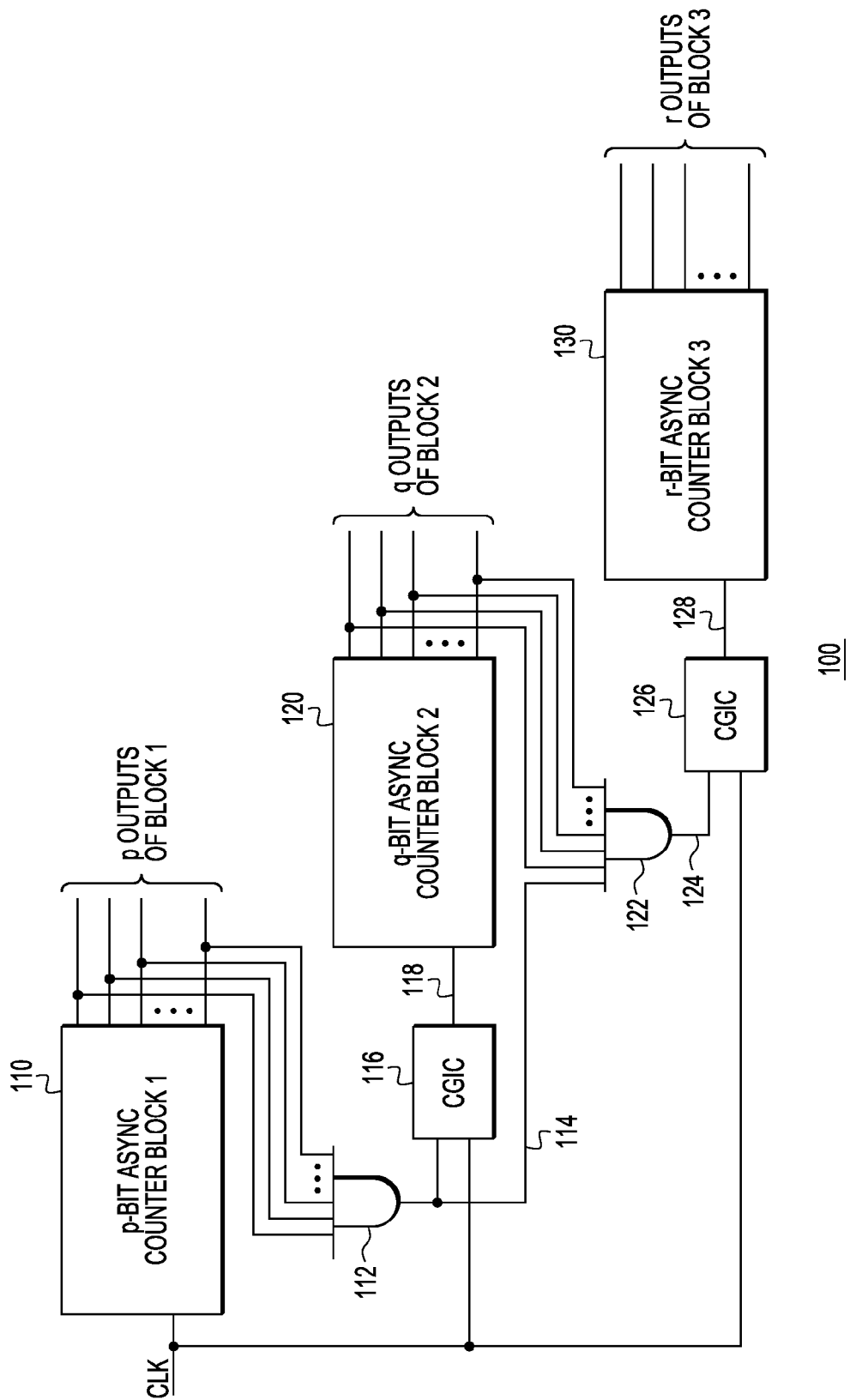
FIG. 1 shows a high-level block diagram of an N-bit hybrid synchronous/asynchronous up-counter according to one embodiment of the present invention.

FIG. 1 shows a high-level block diagram of an N-bit hybrid synchronous/asynchronous up-counter 100 according to one embodiment of the present invention. N-bit hybrid up-counter 100 has three asynchronous (async) up-counter blocks 110, 120, and 130, where async up-counter block 110 is a p-bit asynchronous up-counter that counts the rising edges of input clock signal CLK, async up-counter block 120 is a q-bit asynchronous up-counter, and async up-counter block 130 is a r-bit asynchronous up-counter, where p, q, and r are all positive integers and p+q+r=N.

In particular, async up-counter block 110 generates the p least significant bits (LSBs) of the N-bit count value generated by hybrid up-counter 100, async up-counter block 120 generates the next q significant bits of that N-bit count value, and async up-counter block 130 generates the r most significant bits (MSBs) of that N-bit count value.

Note that p, q, and r may have three different positive integer values, or any two or all three of them may have the same positive integer value. Those skilled in the art will understand that alternative hybrid up-counters of the present invention may have only two async up-counter blocks or four or more async up-counter blocks.

As shown in FIG. 1, the p one-bit outputs from async up-counter block 110 are applied to the p inputs of logic AND gate 112 to generate one-bit asynchronous logic signal 114. One-bit async logic signal 114 is applied along with clock signal CLK to clock gating circuit 116, which retimes one-bit async logic signal 114 based on clock signal CLK to generate one-bit synchronized (sync) logic signal 118, whose transitions from logic 0 to logic 1 are synchronized with rising edges in clock signal CLK.

In particular, as p-bit async up-counter block 110 counts the rising edges in clock signal CLK from a p-bit count value of all zeroes up until a p-bit count value of (p−1) ones followed by the LSB zero, the output of AND gate 112 (i.e., async logic signal 114) remains low (i.e., logic 0), and sync logic signal 118 also remains low. In the next clock cycle, when the p-bit count value from async up-counter block 110 is all ones, async logic signal 114 goes high (i.e., logic 1) and, at the next rising edge of clock signal CLK, sync logic signal 118 also goes high. The transition from logic 0 to logic 1 of sync logic signal 118 causes q-bit async up-counter block 120 to increment its q-bit output value.

During the same clock cycle, the p-bit output from async up-counter block 110 rolls over to all zeros, which causes async logic signal 114 to transition from logic 1 to logic 0. At the next rising edge of CLK, sync logic signal 118 will also transition from logic 1 to logic 0, but that transition does not affect the q-bit output of async up-counter block 120.

In a similar manner, the q bits generated by q-bit async up-counter block 120 along with async logic signal 114 are applied to the (q+1) inputs of logic AND gate 122 to generate one-bit asynchronous logic signal 124. One-bit async logic signal 124 is applied along with clock signal CLK to clock gating circuit 126, which retimes one-bit async logic signal 124 based on clock signal CLK to generate one-bit sync logic signal 128, whose transitions from logic 0 to logic 1 are synchronized with rising edges in clock signal CLK.

In particular, as p-bit async up-counter block 110 counts the rising edges in clock signal CLK and as q-bit async up-counter block 120 counts the 0-to-1 transitions in sync logic signal 118, the async logic signal 124 generated by AND gate 122 remains low until all p+q bits generated by async up-counter blocks 110 and 120 are all ones, as which point, async logic signal 124 goes high and, at the next rising edge of clock signal CLK, sync logic signal 128 also goes high. The transition from logic 0 to logic 1 of sync logic signal 128 causes r-bit async up-counter block 130 to increment its r-bit output value.

During the same clock cycle, the p-bit output from async up-counter block 110 and the q-bit output from async up-counter block 120 both roll over to all zeros, which causes async logic signal 124 to transition from logic 1 to logic 0. At the next rising edge of CLK, sync logic signal 128 will also transition from logic 1 to logic 0, but that transition does not affect the r-bit output of async up-counter block 130.

This processing continues until all p+q+r bits (i.e., N bits) generated by hybrid up-counter 100 are all ones, after which the N-bit counter value rolls over and hybrid up-counter 100 restarts the entire process.

Due to the retiming of the outputs of the first two async up-counter blocks by clock gating circuits 116 and 126, the maximum clock frequency at which hybrid up-counter 100 can accurately count is based on the cumulative clock-to-q delay of the longest async up-counter block, rather than the cumulative clock-to-q delay of the entire hybrid up-counter. For example, if hybrid up-counter 100 were a 64-bit up-counter and if async up-counter blocks 110 and 120 were 21-bit async up-counters and async up-counter block 130 were a 22-bit async up-counter, then the maximum clock frequency at which hybrid up-counter 100 could accurately count would be based on the cumulative clock-to-q delay of async up-counter block 130. In this way, the present invention can be used to provide faster counters without incurring the power consumption disadvantages of conventional synchronous counters. Note that the delay of the logic AND gates also needs to be taken into account when determining the cumulative delays of the various async up-counter blocks.

Figure 2:
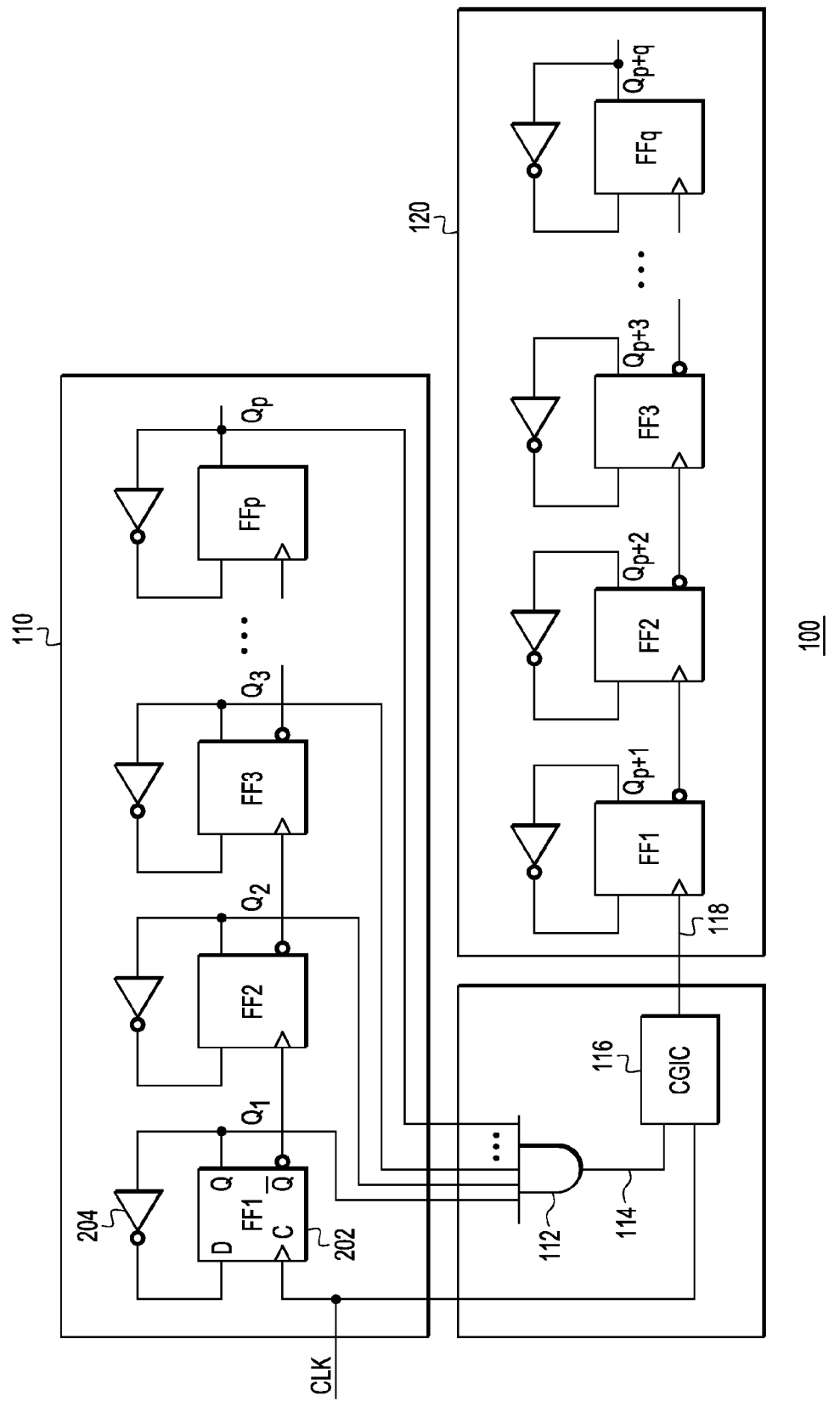
FIG. 2 shows a more detailed circuit diagram of a portion of the hybrid up-counter of FIG. 1.

FIG. 2 shows a more-detailed circuit diagram of a portion of hybrid up-counter 100 of FIG. 1. In particular, FIG. 2 shows p-bit async up-counter block 110, logic AND gate 112, clock gating circuit 116, and q-bit async up-counter block 120. As shown in FIG. 2, async up-counter block 110 has p register stages and async up-counter block 120 has q register stages, where each register stage has a rising-edge triggered flip-flop 202 and an inverter 204.

In operation, whenever a transition from logic 0 to logic 1 appears at its clock input C, flip-flop 202 forwards (i) the value at its data input D to its data output Q and (ii) the inverted value of its data input D to its inverted data output Q_bar, which is applied to the clock input of the flip-flop in the next register stage (if any). Inverter 204 presents the inverted value of data output Q at data input D to await the next logic-0-to-logic-1 transition. In this way, each async up-counter block functions as a multi-bit up-counter in which the Q output of the first register stage is the LSB of the async up-counter block and the Q output of the last register stage is the MSB of the async up-counter block.

Although FIG. 2 depicts each register stage of each async up-counter block having an inverter configured to feed an inverted version of the Q output to the D input, those skilled in the art will understand that, in an alternative implementation, the Q_bar output is fed back to the D input, and the inverter is omitted from each register stage. Those skilled in the art will understand that there are many different ways of implementing the async up-counter blocks of the invention.

Figure 3:
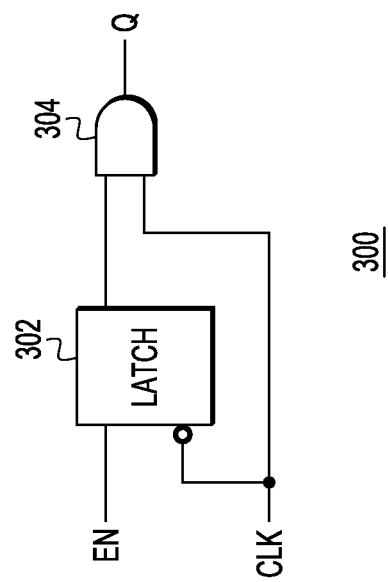
FIG. 3 shows a schematic circuit diagram of a clock gating circuit that can be used to implement each of the clock gating circuits of the hybrid up-counter of FIGS. 1 and 2.

FIG. 3 shows a schematic circuit diagram of a clock gating circuit 300 that can be used to implement each of clock gating circuits 116 and 126 of hybrid up-counter 100. When used to implement clock gating circuit 116, signals EN, CLK, and Q of FIG. 3 are signals 114, CLK, and 118 of FIG. 1. Similarly, when used to implement clock gating circuit 126, signals EN, CLK, and Q of FIG. 3 are signals 124, CLK, and 128 of FIG. 1.

Clock gating circuit 300 includes low level triggered latch 302 and logic AND gate 304. When the clock signal CLK is low, latch 302 forwards asynchronous input signal EN to one input of logic AND gate 304, while the clock signal is also applied to the other AND gate input. If signal EN has a logic 0 value, then output signal Q will be at logic 0 independent of the state of clock signal CLK. If signal EN has a logic 1 value, then output signal Q will be the same as the clock signal CLK. In this way, asynchronous input signal EN is retimed to generate synchronous output signal Q synchronized with the clock signal CLK. Those skilled in the art will understand that FIG. 3 shows just one exemplary way of many different ways of implementing the clock gating function of the invention.

Although the invention has been described in the context of hybrid up-counter 100 of FIG. 1, which counts from all zeros up to all ones before rolling over to all zeros, the invention can also be implemented in the context of hybrid down-counters that count from either all ones down to all zeros or from some specified initial value down to all zeros before rolling over to all ones.

Figure 4:
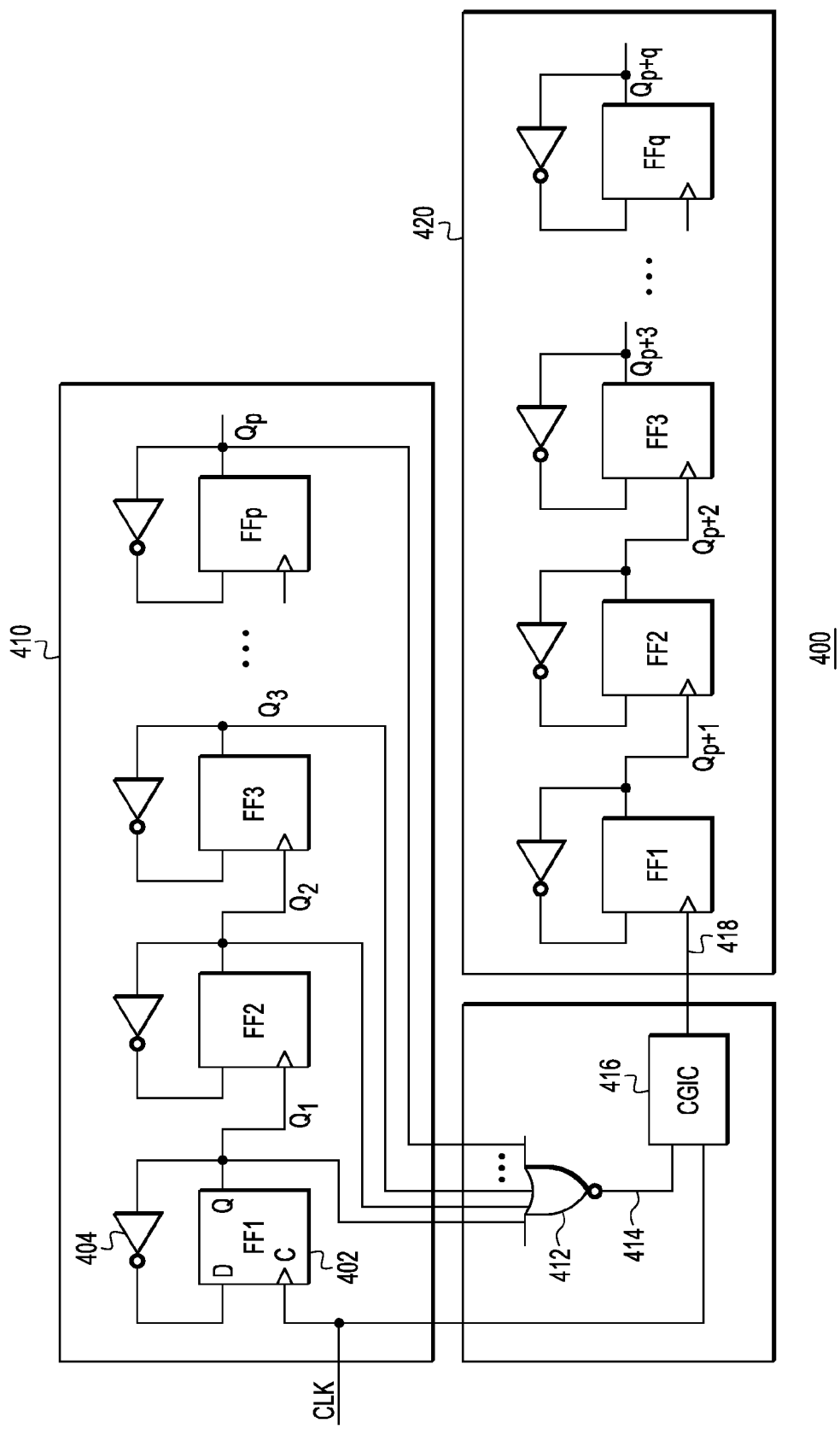
FIG. 4 shows a circuit diagram of a portion of a hybrid down-counter according to another embodiment of the present invention.

FIG. 4 shows a circuit diagram of a portion of a hybrid down-counter 400 according to an alternative embodiment of the invention. Hybrid down-counter 400 is similar to hybrid up-counter 100 of FIGS. 1-3 with analogous elements identified using similar labels, except that, in hybrid down-counter 400, (i) register Q outputs (instead of register Q_bar outputs as in hybrid up-counter 100) are connected to subsequent register clock inputs and (ii) logic gate 412 is a logic NOR gate (instead of a logic AND gate as in hybrid up-counter 100).

Analogous to FIG. 2, FIG. 4 shows two async downconverter blocks: p-bit async down-counter block 410 and q-bit async down-counter block 420. Depending on the particular implementation and analogous to hybrid up-counter 100, hybrid down-counter 400 may have one or more additional sets of NOR gates, clock gating circuits, and async down-counter blocks downstream of async down-counter block 420.

Unless stated otherwise, terms such as "first" and "second" are used to arbitrarily distinguish between the elements such terms describe. Thus, these terms are not necessarily intended to indicate temporal or other prioritization of such elements. Further, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The invention claimed is:

1. A hybrid counter configured to generate a multi-bit hybrid counter value based on an applied clock signal, the hybrid counter comprising:
   a first asynchronous counter that generates, based on the applied clock signal, a first asynchronous multi-bit counter value corresponding to a first subset of the bits of the multi-bit hybrid counter value;
   a first logic gate that generates a first asynchronous logic value based on the first subset of bits;
   a first clock gating circuit that generates a first synchronous logic value based on the first asynchronous logic value and the applied clock signal; and
   a second asynchronous counter that generates, based on the first synchronous logic value, a second asynchronous multi-bit counter value corresponding to a second subset of the bits of the multi-bit hybrid counter value.

2. The hybrid counter of claim 1, further comprising:
   one or more additional logic gates, each configured to generate an additional asynchronous logic value based on one or more previous subsets of bits;
   one or more additional clock gating circuits, each configured to generate an additional synchronous logic value based on a corresponding additional asynchronous logic value and the applied clock signal; and
   one or more additional asynchronous counters, each configured to generate, based on a corresponding preceding synchronous logic value, an additional multi-bit counter value corresponding to an additional subset of the bits of the multi-bit hybrid counter value.

3. The hybrid counter of claim 1, wherein the first clock gating circuit is configured to re-time the first asynchronous logic value based on the applied clock signal to generate the first synchronous logic value.

4. The hybrid counter of claim 1, wherein the hybrid counter is an up-counter and the first and second asynchronous counters are asynchronous up-counters.

5. The hybrid counter of claim 4, wherein the first logic gate is a logic AND gate.

6. The hybrid counter of claim 1, wherein the hybrid counter is a down-counter and the first and second asynchronous counters are asynchronous down-counters.

7. The hybrid counter of claim 6, wherein the first logic gate is a logic NOR gate.

8. The hybrid counter of claim 1, wherein the first subset of bits are least-significant bits of the multi-bit hybrid counter value.

9. The hybrid counter of claim 1, wherein accuracy of the hybrid counter is limited by the asynchronous counter having the largest cumulative delay.

10. The hybrid counter of claim 9, wherein the cumulative delay of the hybrid counter is less than the cumulative delay of a single multi-bit asynchronous counter configured to generate the multi-bit hybrid counter value.

11. The hybrid counter of claim 1, wherein power consumption of the hybrid counter is less than the power consumption of a single multi-bit synchronous counter configured to generate the multi-bit hybrid counter value.

12. A hybrid counter for generating a multi-bit hybrid counter value, the hybrid counter comprising:
   two or more pairs of asynchronous counters, each asynchronous counter configured to generate a subset of bits of the multi-bit hybrid counter value;
   a logic gate and a clock gating circuit interconnecting each pair of the asynchronous counters, wherein:
      the logic gate generates an asynchronous logic value based on bits generated by one or more previous asynchronous counters; and
      the clock gating circuit re-times the asynchronous logic value to generate a synchronous logic value that is used to toggle a next asynchronous counter.

* * * * *